(12) United States Patent
Shi

(10) Patent No.: US 9,224,614 B2
(45) Date of Patent: Dec. 29, 2015

(54) CMP SLURRY/METHOD FOR POLISHING RUTHENIUM AND OTHER FILMS

(71) Applicant: AIR PRODUCTS AND CHEMICALS, INC., Allentown, PA (US)

(72) Inventor: Xiaobo Shi, Chandler, AZ (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 14/530,965

(22) Filed: Nov. 3, 2014

(65) Prior Publication Data

US 2015/0050809 A1     Feb. 19, 2015

Related U.S. Application Data

(62) Division of application No. 13/325,459, filed on Dec. 14, 2011, now Pat. No. 8,906,123.

(60) Provisional application No. 61/427,857, filed on Dec. 29, 2010.

(51) Int. Cl.
| | |
|---|---|
| *H01L 21/306* | (2006.01) |
| *H01L 21/321* | (2006.01) |
| *C09K 3/14* | (2006.01) |
| *C09G 1/02* | (2006.01) |

(52) U.S. Cl.
CPC ............... *H01L 21/306* (2013.01); *C09G 1/02* (2013.01); *C09K 3/1463* (2013.01); *H01L 21/3212* (2013.01)

(58) Field of Classification Search
CPC .... H01L 21/3212; H01L 21/306; C09G 1/02; C09K 3/1463
See application file for complete search history.

(56) References Cited

U.S. PATENT DOCUMENTS

| | | |
|---|---|---|
| 4,789,648 A | 12/1988 | Chow et al. |
| 6,328,774 B1 | 12/2001 | Sherno et al. |
| 7,204,936 B2 * | 4/2007 | Kitayama et al. ............ 252/79.1 |
| 2004/0132385 A1 | 7/2004 | Kitayama et al. |
| 2011/0039412 A1 | 2/2011 | Park et al. |

FOREIGN PATENT DOCUMENTS

TW      201043572 A    12/2010

OTHER PUBLICATIONS

Shinn, G.B., et al., "Chemical-Mechanical Polishing"; Handbook of Semiconductor Manufacturing Technology; Chapter 15; pp. 415-460; 2000.

* cited by examiner

*Primary Examiner* — Duy Deo
*Assistant Examiner* — Mahmoud Dahimene
(74) *Attorney, Agent, or Firm* — Lina Yang

(57) ABSTRACT

A method and associated composition for CMP processing of noble metal-containing substrates (such as ruthenium-containing substrates) afford both high removal rates of the noble metal and are tunable with respect to rate of noble metal removal in relation to removal of other films. Low levels of an oxidizing agent containing one or more peroxy-functional group(s) can be used along with a novel ligand to effectively polish noble metal substrates.

10 Claims, 2 Drawing Sheets

… (1) …

CMP SLURRY/METHOD FOR POLISHING RUTHENIUM AND OTHER FILMS

CROSS-REFERENCE TO RELATED APPLICATIONS

Figure 1:
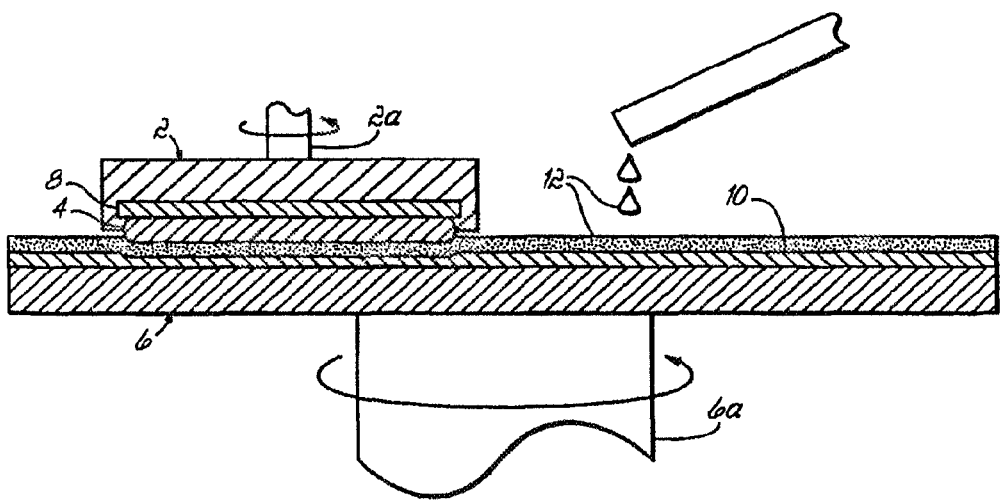
Figure 2:
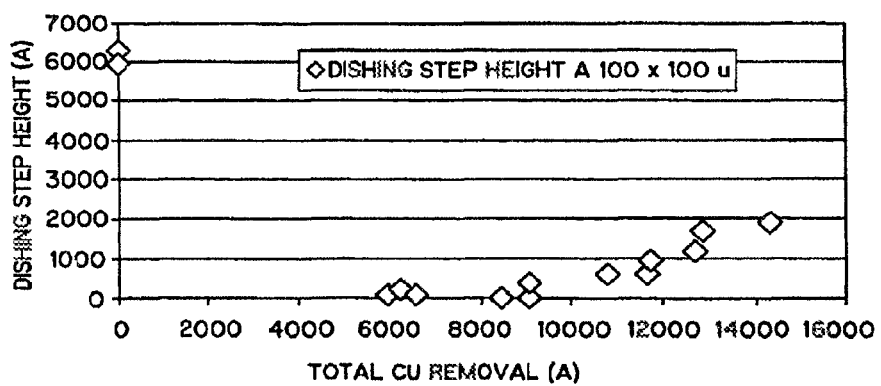
Figure 3:
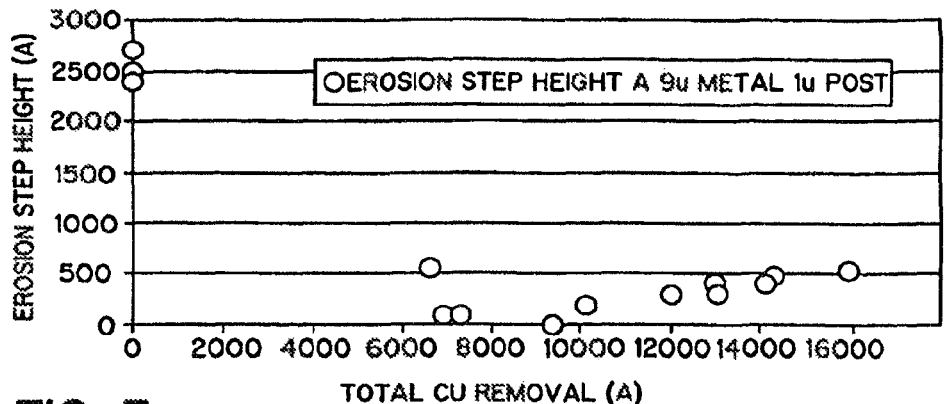
Figure 4:
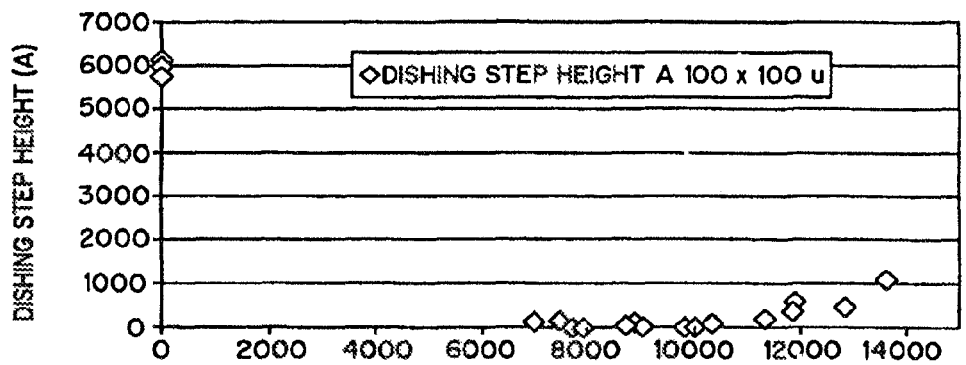
Figure 5:
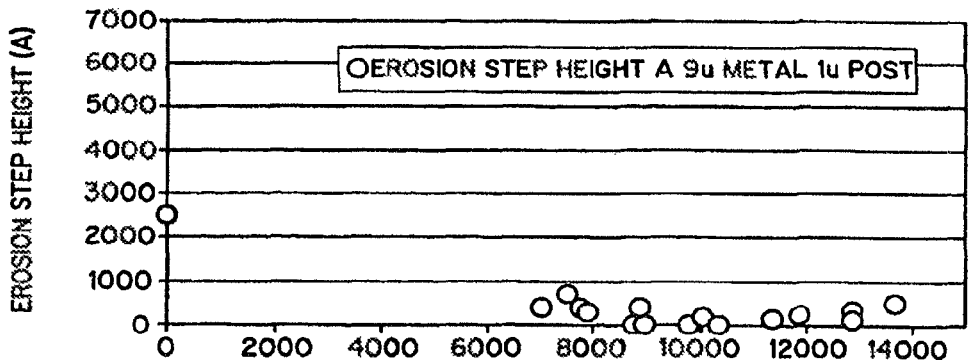

This application is a divisional application of U.S. non-provisional application Ser. No. 13/325,459, filed Dec. 14, 2011; which claims benefit of a U.S. Provisional Application No. 61/427,857, filed Dec. 29, 2010. The disclosures of the non-provisional application and the provisional application are hereby incorporated by reference.

BACKGROUND OF THE INVENTION

This invention relates to chemical mechanical planarization (CMP) of metal-containing substrates in semiconductor manufacture and particularly to ruthenium and/or other metal barrier CMP slurries for second stage polishing of patterned wafers to achieve global planarization.

Chemical mechanical planarization (chemical mechanical polishing, CMP) for planarization of semiconductor substrates is now widely known to those skilled in the art and has been described in numerous patents and open literature publications. An introductory reference on CMP is as follows: "Chemical-Mechanical Polish" by G. B. Shinn et al., Chapter 15, pages 415-460, in Handbook of Semiconductor Manufacturing Technology, editors: Y. Nishi and R. Doering, Marcel Dekker, New York City (2000).

In a typical CMP process, a substrate (e.g., a wafer) is placed in contact with a rotating polishing pad attached to a platen. A CMP slurry, typically an abrasive and chemically reactive mixture, is supplied to the pad during CMP processing of the substrate. During the CMP process, the pad (fixed to the platen) and substrate are rotated while a wafer carrier system or polishing head applies pressure (downward force) against the substrate. The slurry accomplishes the planarization (polishing) process by chemically and mechanically interacting with the substrate film being planarized due to the effect of the rotational movement of the pad parallel to the substrate. Polishing is continued in this manner until the desired film on the substrate is removed with the usual objective being to effectively planarize the substrate. Typically metal CMP slurries contain an abrasive material, such as silica or alumina, suspended in an oxidizing, aqueous medium.

There are a large number of materials used in the manufacture of integrated circuits such as a semiconductor wafer. The materials generally fall into three categories—dielectric material, adhesion and/or barrier layers, and conductive layers. The use of the various substrates, e.g., dielectric material such as TEOS, PETEOS, and low-k dielectric materials; barrier/adhesion layers such as tantalum, titanium, tantalum nitride, and titanium nitride; and conductive layers such as copper, aluminum, tungsten, and noble metals are known in the industry.

Integrated circuits are interconnected through the use of well-known multilevel interconnections. Interconnection structures normally have a first layer of metallization, an interconnection layer, a second level of metallization, and typically third and subsequent levels of metallization. Interlevel dielectric materials such as silicon dioxide and sometimes low-k materials are used to electrically isolate the different levels of metallization in a silicon substrate or well. The electrical connections between different interconnection levels are made through the use of metalized vias and in particular tungsten vias. U.S. Pat. No. 4,789,648 describes a method for preparing multiple metalized layers and metalized vias in insulator films. In a similar manner, metal contacts are used to form electrical connections between interconnection levels and devices formed in a well. The metal vias and contacts are generally filled with tungsten and generally employ an adhesion layer such as titanium nitride (TiN) and/or titanium to adhere a metal layer such as a tungsten metal layer to the dielectric material.

In one semiconductor manufacturing process, metalized vias or contacts are formed by a blanket tungsten deposition followed by a CMP step. In a typical process, via holes are etched through the interlevel dielectric (ILD) to interconnection lines or to a semiconductor substrate. Next, a thin adhesion layer such as titanium nitride and/or titanium is generally formed over the ILD and is directed into the etched via hole. Then, a tungsten film is blanket deposited over the adhesion layer and into the via. The deposition is continued until the via hole is filled with tungsten. Finally, the excess tungsten is removed by chemical mechanical polishing (CMP) to form metal vias.

The ratio of the removal rate of a metal (e.g., ruthenium) to the removal rate of a dielectric base is called the "selectivity" for removal of the metal in relation to removal of the dielectric during CMP processing of substrates comprised of metal and dielectric material. When CMP slurries with high selectivity for removal of metal in relation to dielectric are used, the metal layers are easily over-polished creating a depression or "dishing" effect in the metalized areas. This feature distortion is unacceptable due to lithographic and other constraints in semiconductor manufacturing.

Another feature distortion that is unsuitable for semiconductor manufacturing is called "erosion." Erosion is the topography difference between a field of dielectric and a dense array of metal vias or trenches. In CMP, the materials in the dense array may be removed or eroded at a faster rate than the surrounding field of dielectric. This causes a topography difference between the field of dielectric and the dense metal (e.g., ruthenium, copper or tungsten) array.

CMP processing is often employed to remove and planarize excess copper metal at different stages of semiconductor manufacturing. For example, one way to fabricate a multilevel copper interconnect or planar copper circuit traces on a silicon dioxide substrate is referred to as the damascene process. In a semiconductor manufacturing process typically used to form a multilevel copper interconnect, metalized copper lines or copper vias are formed by electrochemical metal deposition followed by copper CMP processing. In a typical process, the interlevel dielectric (ILD) surface is patterned by a conventional dry etch process to form vias and trenches for vertical and horizontal interconnects and make connection to the sublayer interconnect structures. The patterned ILD surface is coated with an adhesion-promoting layer such as titanium or tantalum and/or a diffusion barrier layer such as titanium nitride or tantalum nitride over the ILD surface and into the etched trenches and vias. The adhesion-promoting layer and/or the diffusion barrier layer is then overcoated with copper, for example, by a seed copper layer and followed by an electrochemically deposited copper layer. Electro-deposition is continued until the structures are filled with the deposited metal. Finally, CMP processing is used to remove the copper overlayer, adhesion-promoting layer, and/or diffusion barrier layer (e.g., ruthenium), until a planarized surface with exposed elevated portions of the dielectric (silicon dioxide and/or low-k) surface is obtained. The vias and trenches remain filled with electrically conductive copper forming the circuit interconnects.

When one-step copper CMP processing is desired, it is usually important that the removal rate of the metal and barrier layer material be significantly higher than the removal rate for dielectric material in order to avoid or minimize dishing of metal features or erosion of the dielectric. Alternatively, a multi-step copper CMP process may be employed involving the initial removal and planarization of the copper overburden, referred to as a step 1 copper CMP process, followed by a barrier layer CMP process. The barrier layer CMP process is frequently referred to as a barrier or step 2 copper CMP process. Previously, it was believed that the removal rate of the copper and the adhesion-promoting layer and/or the diffusion barrier layer must both greatly exceed the removal rate of dielectric so that polishing effectively stops when elevated portions of the dielectric are exposed. The ratio of the removal rate of copper to the removal rate of dielectric base is called the "selectivity" for removal of copper in relation to dielectric during CMP processing of substrates comprised of copper, ruthenium and dielectric material. The ratio of the removal rate of ruthenium to the removal rate of dielectric base is called the "selectivity" for removal of ruthenium in relation to dielectric during CMP processing. When CMP slurries with high selectivity for removal of copper and ruthenium in relation to dielectric are used, the copper layers are easily over-polished creating a depression or "dishing" effect in the copper vias and trenches. This feature distortion is unacceptable due to lithographic and other constraints in semiconductor manufacturing.

As industry standards trend toward smaller device features, there is an ever-developing need for CMP slurries that deliver superior planarization of the nanostructures of IC chips. Specifically, for 45 nm technology nodes and smaller feature sizes, slurry products must deliver low removal rate selectivity between metal and dielectric, thereby lowering erosion while maintaining sufficient removal rate and low defect levels. Furthermore, in the competitive market of CMP consumables, low cost of ownership (CoO), specifically through concentration of CMP slurry, is quickly becoming an industry standard.

A typically used CMP slurry has two actions, a chemical component and a mechanical component. An important consideration in slurry selection is "passive etch rate." The passive etch rate is the rate at which a metal (e.g., copper) is dissolved by the chemical component alone and should be significantly lower than the removal rate when both the chemical component and the mechanical component are involved. A large passive etch rate leads to dishing of the metallic trenches and vias, and thus, preferably, the passive etch rate is less than 10 nanometers per minute.

These are two general types of layers that can be polished. The first layer is interlayer dielectrics (ILD), such as silicon oxide and silicon nitride. The second layer is metal layers such as tungsten, copper, aluminum, etc., which are used to connect the active devices.

In the case of CMP of metals, the chemical action is generally considered to take one of two forms. In the first mechanism, the chemicals in the solution react with the metal layer to continuously form an oxide layer on the surface of the metal. This generally requires the addition of an oxidizer to the solution such as hydrogen peroxide, ferric nitrate, etc. Then the mechanical abrasive action of the particles continuously and simultaneously removes this oxide layer. A judicious balance of these two processes obtains optimum results in terms of removal rate and polished surface quality.

In the second mechanism, no protective oxide layer is formed. Instead, the constituents in the solution chemically attack and dissolve the metal, while the mechanical action is largely one of mechanically enhancing the dissolution rate by such processes as continuously exposing more surface area to chemical attack, raising the local temperature (which increases the dissolution rate) by the friction between the particles and the metal and enhancing the diffusion of reactants and products to and away from the surface by mixing and by reducing the thickness of the boundary layer.

The slurry composition is an important factor in the CMP step. Depending on the choice of the oxidizing agent, the abrasive, and other useful additives, the polishing slurry can be tailored to provide effective polishing of metal layers at desired polishing rates while minimizing surface imperfections, defects, corrosion, and erosion of oxide in areas with tungsten vias. Furthermore, the polishing slurry may be used to provide controlled polishing selectivity to other thin-film materials used in current integrated circuit technology such as titanium, titanium nitride and the like.

There is a significant need for barrier metal CMP process(es) and slurry(s) that afford high removal rates of ruthenium (or other noble metal) in which ruthenium (or other noble metal) removal rates are tunable relative to the removal rates of other materials (e.g., copper, dielectric, etc.). This is especially significant since barrier layer polishing is increasingly used in semiconductor manufacture as this industry continues to move towards smaller and smaller feature sizes. The present invention provides a solution to this significant need.

SUMMARY OF THE INVENTION

In an embodiment, the invention is a method for chemical mechanical planarization of a surface having at least one feature thereon comprising a noble metal, said method comprising the steps of:
 A) placing a substrate having the surface having the at least one feature thereon comprising the noble metal in contact with a polishing pad;
 B) delivering a polishing composition having a pH which is basic, comprising:
  a) an abrasive;
  b) a cyanate salt; and
  c) an oxidizing agent containing at least one peroxy-functional group; and
 C) polishing the substrate with the composition.

In an embodiment, the invention is a polishing composition having a pH which is basic, comprising:
 a) an abrasive;
 b) a cyanate salt; and
 c) an oxidizing agent containing at least one peroxy-functional group.

DETAILED DESCRIPTION OF THE INVENTION

As indicated above, the invention is a method and associated composition for CMP processing of a substrate having at least one feature thereon comprising a noble metal, such as ruthenium. The method entails placing the substrate in contact with a polishing pad, delivering a polishing composition, and then polishing the substrate with the composition, which contains an abrasive, a cyanate salt, and an oxidizing agent that has at least one peroxy-functional group.

In an embodiment, the cyanate salt is selected from sodium cyanate, potassium cyanate, and ammonium cyanate. While sodium and potassium cyanates can afford similar polishing performance, use of sodium cyanate is not desirable since sodium ions may migrate across dielectric film to cause possible cross talk between different metal vias or lines (which could lead to device failure). In contrast, use of a potassium salt (e.g., potassium cyanate) is desirable since larger potassium ions have much less tendency to undergo metal ion migration than do smaller sodium ions. In CMP applications, slurries comprising ammonium ions can often exhibit significantly different (and generally poorer) polishing performance versus slurries comprised of either sodium ions or potassium ions. In an embodiment, the cyanate salt is selected from potassium cyanate and ammonium cyanate. In a preferred embodiment, the cyanate salt is potassium cyanate. The level of the cyanate salt can range from 0.2 weight % to 4 weight %. If the level of cyanate salt is greater than 4 weight %, the stability of the slurry is significantly decreased. If the level of cyanate salt is less than 0.2 weight %, the desired effect of the cyanate salt in boosting the removal rate of ruthenium (or other noble metal) while reducing the removal rate of copper (or other non-noble metal) is too low.

In an embodiment, the oxidizing agent is any compound containing at least one peroxy-functional group. In an embodiment, the oxidizing agent is selected from periodic acid and a salt of periodic acid. The salt of periodic acid can be, but is not limited to, sodium periodate, potassium periodate, and ammonium periodate. In an embodiment, the salt of periodic acid is selected from potassium periodate and ammonium periodate. In a preferred embodiment, the salt of periodic acid is potassium periodate. The level of the oxidizing agent containing at least one peroxy-functional group can range from 0.01 weight % to 2.0 weight %.

In the method and associated composition, the composition has a pH which is basic (pH greater than 7) in an embodiment. In another embodiment, the pH ranges from about 8 to about 13. In another embodiment, the pH ranges from about 9 to about 12. In a preferred embodiment, the pH ranges from 10 to 11. If the pH is less than about 9, the removal rate of ruthenium may be (undesirably) low. If the pH is greater than about 12, a significant amount of abrasive (e.g., colloidal silica) may be dissolved to form soluble gels which can result in undesirable residues being deposited on the polished wafer surfaces during CMP processing.

The method of the invention is for CMP processing of a substrate having at least one feature thereon comprising a noble metal. The noble metal can be, but, is not limited to, ruthenium. In an embodiment, the noble metal is selected from the group consisting of ruthenium (Ru), rhodium (Rh), palladium (Pd), osmium (Os), iridium (Ir), platinum (Pt), silver (Ag), gold (Au), alloys thereof, oxides thereof, and combinations thereof. In another embodiment, the noble metal is selected from the group consisting of ruthenium (Ru), rhodium (Rh), palladium (Pd), osmium (Os), iridium (Ir), platinum (Pt), silver (Ag), and gold (Au). Ruthenium is a preferred noble metal.

In the method and associated composition, the composition may further comprise d) alkyl or aryl sulfonate ions. A non-limiting example is that the composition may further comprise benzene sulfonic acid (BSA) ions.

A novel ligand used in the CMP barrier slurry disclosed herein is potassium cyanate (KOCN). While not being bound by theory, the inventor(s) believe that cyanate in this invention is acting as a ligand, and may be able to react with both $RuO_x$ and $CuO_x$ in aqueous slurry solution at high pH levels to form Ru-cyanate and Cu-cyanate complexes. In general, these $M^{(n+)}$-cyanate complexes are believed to be softer than the corresponding $M^{(n+)}$-oxide films. Consequently, these complexes in the inventive slurry impart desirable removal rates of ruthenium and copper films during CMP processing according to the invention.

The combination of periodate and cyanate in the inventive barrier slurry to achieve an additive effect on the removal rates of ruthenium films is surprising and unexpected. The introduction of cyanate into slurry formulations that contain periodate (e.g., potassium periodate) significantly boosts ruthenium removal rates. This approach provides for use of a lower concentration of potassium periodate in the slurry while still maintaining a similar rate of ruthenium removal to a comparable slurry having a higher periodate level.

A significant advantage of this invention which include the compositions and pH conditions is that CMP processing according to the invention has prevented in-situ formation of toxic $RuO_4$ compound. While not being bound by theory, the inventor believes the presence of cyanate anion in the slurry/method of this invention functions as an efficient ligand which can effectively bond to the oxidized Ru(n+, mainly Ru+4 cations) species present during CMP processing to prevent the propensity for undesirable $RuO_4$ formation.

$KIO_4$ is selected and used as the oxidizing agent to induce the needed oxidation reactions on metal ruthenium film surfaces in this invention because it becomes a weak oxidizing reagent as pH of the slurry containing this oxidizing agent becomes more alkaline. At alkaline conditions, $KIO_4$ is considered to be a weaker oxidizing agent than hydrogen peroxide. Therefore, in various embodiment(s) of the current invention, $KIO_4$ is selected as the oxidant. In addition to functioning as oxidant to oxidize ruthenium metal films to ruthenium cations, $IO_4$—also partly functions as a weak ligand to compete with cyanate ions to bond to ruthenium cations on the surface of ruthenium films. Therefore, removal rates and selectivities can be tuned through adjusting the ratios between $KIO_4$ and cyanate ions.

The polishing composition and method described herein will be illustrated in more detail with reference to the following examples, but it should be understood that it is not deemed to be limited thereto.

EXAMPLES

Polishing Pad—Polishing pad, Fujibo H7000HN, was used during CMP, supplied by Narubeni America Corporation.

Parameters:

Å: angstrom(s)—a unit of length

BP: back pressure, in psi units

CMP: chemical mechanical planarization=chemical mechanical polishing

CS: carrier speed

DF: Down force: pressure applied during CMP, units psi min: minute(s)

ml: milliliter(s)

mV: millivolt(s)

psi: pounds per square inch

PS: platen rotational speed of polishing tool, in rpm (revolution(s) per minute)

SF: polishing composition flow, ml/min

Removal Rates and Selectivity

| | |
|---|---|
| Ru RR 2.0 psi | Measured ruthenium removal rate at 2.0 psi down pressure of the CMP tool |
| Cu RR 2.0 psi | Measured copper removal rate at 2.0 psi down pressure of the CMP tool |
| Ta RR 2.0 psi | Measured tantalum removal rate at 2.0 psi down pressure of the CMP tool |

-continued

| | |
|---|---|
| BD-1 RR 2.0 psi | Measured BD-1 removal rate at 2.0 psi down pressure of the CMP tool |
| TEOS RR 2.0 psi | Measured TEOS removal rate at 2.0 psi down pressure of the CMP tool |
| Materials | |
| Black Diamond | A low-k material that is a carbon-doped silicon dioxide and which is composed of the following four elements: silicon, carbon, oxygen, and hydrogen. |
| BD-1 | This is a particular type of Black Diamond film. |

General Experimental Procedure

All percentages are weight percentages unless otherwise indicated. In the examples presented below, CMP experiments were run using the procedures and experimental conditions given below. The CMP tool that was used in the examples is a IPEC 472, manufactured by Novellus Systems, Inc., 4000 North First Street, San Jose, Calif., 95134. A Fujibo H7000HN pad, supplied by Narubeni America Corporation, was used on the platen for the blanket wafer polishing studies. Pads were broken-in by polishing twenty-five dummy oxide (deposited by plasma enhanced CVD from a TEOS precursor, PETEOS) wafers. In order to qualify the tool settings and the pad break-in, two PETEOS monitors were polished with Syton® OX-K colloidal silica, supplied by DuPont Air Products NanoMaterials L.L.C., at baseline conditions. Polishing experiments were conducted using electroplating deposited copper, BD-1 (a particular type of black diamond low-k film), TEOS and tantalum wafers. These blanket wafers were purchased from Silicon Valley Microelectronics, 1150 Campbell Ave, CA, 95126, and Advantiv Corporation. The film thickness specifications are summarized below:
Copper: 10,000 Å electroplated copper/1,000 Å copper seed/250 Å Ta on silicon
Ruthenium: 2,000 Å PVD Ru/over Ta on silicon
Tantalum: 2,000 Å/5,000 Å thermal oxides on silicon
BD: BD1 10,000 Å
TEOS: 15,000 Å
All examples in this patent application were run using a CMP processor at 2 psi down force.
All percentages are weight percentages unless otherwise indicated.

Example 1

A slurry was made up having the following composition and pH: 0.6787% KOH+0.15% KIO4+1.0% potassium cyanate+0.4388% BSA+0.010% 1,2,4-triazole+3.0% Fuso PL-3 colloidal silica+DI-H2O (balance); pH value was between 10.9-11.0.
The slurry was used in CMP experiments to measure removal rates during CMP processing for the following films: Ru, Cu, Ta, BD-1, and TEOS. The results obtained for this slurry are summarized in Table 1.

Example 2

A slurry was made up having the following composition and pH: 0.6787% KOH+0.30% KIO4+0.4388% BSA+0.010% 1,2,4-triazole+3.0% Fuso PL-3 colloidal silica+DI-H2O (balance); pH value was between 10.9-11.0.
The slurry was used in CMP experiments to measure removal rates during CMP processing for the following films: Ru, Cu, Ta, BD-1, and TEOS. The results obtained for this slurry are summarized in Table 1.

Example 3

A slurry was made up having the following composition and pH: 0.15% KIO4+0.010% 1,2,4-triazole+3.0% Fuso PL-2 colloidal silica+DI-H2O (balance); KOH was used to adjust pH value to between 10.9-11.0.
The slurry was used in CMP experiments to measure removal rates during CMP processing for the following films: Ru and Cu. The results obtained for this slurry are summarized in Table 1.

Example 4

A slurry was made up having the following composition and pH: 0.15% KIO4+1.0% potassium cyanate+0.010% 1,2,4-triazole+3.0% Fuso PL-2 colloidal silica+DI-H2O (balance);); KOH was used to adjust pH value to between 10.9-11.0.
The slurry was used in CMP experiments to measure removal rates during CMP processing for the following films: Ru and Cu. The results obtained for this slurry are summarized in Table 1.

TABLE 1

Removal Rates of Polishing Different Films Using Example 1-4 Slurries

| Films polished | RR (in Å) of Example 1 Slurry | RR (in Å) of Example 2 Slurry | RR (in Å) of Example 3 Slurry | RR (in Å) of Example 4 Slurry |
|---|---|---|---|---|
| Ru | 345 | 349 | 283 | 391 |
| Cu | 234 | 696 | 561 | 281 |
| Ta | 381 | 305 | n/a | n/a |
| BD-1 | 1332 | 1236 | n/a | n/a |
| TEOS | 626 | 607 | n/a | n/a |

Key: Ru = Ruthenium film
Cu = Copper film
Ta = Tantalum film
BD-1 = Black Diamond film (Manufactured by SVTC, Austin, TX)
TEOS = Tetraethylorthosilicate As shown by the results for Examples 1 and 2 in Table 1, the ruthenium removal rates are essentially the same for these two compositions. The Example 1 slurry has one half the level of potassium periodate of that in the Example 2 slurry but has potassium cyanate at 1 weight percent.

The slurries of Examples 3 and 4 have the same level of potassium periodate. The Example 4 slurry contains potassium cyanate while the Example 2 slurry does not contain this component. Comparision of ruthenium removal rates for these examples illustrates that the Example 4 slurry has a significantly higher ruthenium removal rate relative to that of the Example 3 slurry. Comparison of copper removal rates for these examples illustrates that the Example 4 slurry has a significantly lower copper removal rate relative to that of the Example 3 slurry.

The above results illustrate that introduction of potassium cyanate into slurry formulations that contain potassium periodate affords (desirably) higher ruthenium removal rates being attained. This approach provides a means for desirably lowering the level of periodate oxidizing agent in these slurries while still maintaining similar levels of ruthenium removal rates.

The invention claimed is:

1. A method for chemical mechanical planarization of a surface having at least one feature thereon comprising a noble metal, said method comprising the steps of:
   A) placing a substrate having the surface having the at least one feature thereon comprising the noble metal in contact with a polishing pad;
   B) delivering a polishing composition having a pH which is basic, comprising:
      a) an abrasive;
      b) a cyanate salt; and
      c) an oxidizing agent containing at least one peroxy-functional group; and
   C) polishing the substrate with the composition.

2. The method of claim 1 wherein the cyanate salt is selected from sodium cyanate, potassium cyanate, and ammonium cyanate.

3. The method of claim 1 wherein the oxidizing agent is selected from periodic acid and a salt of periodic acid.

4. The method of claim 3 wherein the salt of periodic acid is potassium periodate.

5. The method of claim 1 wherein the noble metal is selected from the group consisting of ruthenium (Ru), rhodium (Rh), palladium (Pd), osmium (Os), iridium (Ir), platinum (Pt), silver (Ag), gold (Au), alloys thereof, oxides thereof, and combinations thereof.

6. The method of claim 5 wherein the noble metal is ruthenium.

7. The method of claim 1 wherein the pH ranges from 9 to 12.

8. The method of claim 1 wherein the level of the cyanate salt ranges from 0.2 weight % to 4 weight %.

9. The method of claim 1 wherein the level of the oxidizing agent containing at least one peroxy-functional group ranges from 0.01 weight % to 2.0 weight %.

10. The method of claim 1 wherein the polishing composition further comprises d) alkyl or aryl sulfonate ions.

* * * * *